(12) United States Patent
Li et al.

(10) Patent No.: US 8,628,341 B2
(45) Date of Patent: Jan. 14, 2014

(54) PLUGGABLE MECHANISM, PRODUCTION BOARD AND SUBRACK HAVING THE PLUGGABLE MECHANISM

(75) Inventors: Shuang Li, Hangzhou (CN); Jun Zhao, Shenzhen (CN); Yao Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 3 days.

(21) Appl. No.: 13/489,706

(22) Filed: Jun. 6, 2012

(65) Prior Publication Data

US 2012/0240704 A1   Sep. 27, 2012

Related U.S. Application Data

(63) Continuation of application No. PCT/CN2011/073627, filed on May 4, 2011.

(30) Foreign Application Priority Data

Jun. 28, 2010   (CN) .......................... 2010 1 0213955

(51) Int. Cl.
   *H01R 13/62*   (2006.01)
(52) U.S. Cl.
   USPC ........................................ 439/157; 439/377
(58) Field of Classification Search
   USPC ................... 439/157–160, 342; 361/684, 798
   See application file for complete search history.

(56) References Cited

U.S. PATENT DOCUMENTS

| | | | |
|---|---|---|---|
| 5,110,301 A * | 5/1992 | Inoue et al. .................. | 439/310 |
| 5,657,204 A | 8/1997 | Hunt | |
| 6,674,651 B2 | 1/2004 | Momiyama et al. | |
| 6,685,489 B1 * | 2/2004 | Rubenstein et al. .......... | 439/157 |
| 7,145,780 B2 | 12/2006 | Malone et al. | |
| 7,297,015 B1 | 11/2007 | Desrosiers et al. | |
| 7,435,114 B2 * | 10/2008 | Desrosiers et al. ........... | 439/157 |
| 8,282,422 B2 * | 10/2012 | Hamner et al. ............... | 439/631 |
| 2003/0129878 A1 * | 7/2003 | Hasircoglu et al. .......... | 439/608 |
| 2005/0111178 A1 * | 5/2005 | Bradley et al. ................ | 361/684 |
| 2006/0215373 A1 * | 9/2006 | Joist et al. ..................... | 361/726 |
| 2008/0153331 A1 * | 6/2008 | Desrosiers et al. ........... | 439/157 |

FOREIGN PATENT DOCUMENTS

| | | |
|---|---|---|
| CN | 2855010 | 1/2007 |
| CN | 101873781 | 10/2010 |

OTHER PUBLICATIONS

English-language International Search Report for International Application No. PCT/CN2011/073627 mailed Jul. 28, 2011 from The State Intellectual Property Office, the P.R. China, Beijing, China.

* cited by examiner

*Primary Examiner* — R S Luebke
*Assistant Examiner* — Larisa Tsukerman

(57) ABSTRACT

A pluggable mechanism, disposed between a bearing board and a to-be-inserted board, includes: a gear wrench hinged on the bearing board, where the gear wrench comprises a handle and a drive tooth part; and a swing gear, hinged on the bearing board and connected to the to-be-inserted board, where the swing gear comprises a gearing tooth part meshing with the drive tooth part, and the to-be-inserted board moves with the move of the swing gear. A production board including the above pluggable mechanism is also disclosed. A subrack including the above production board is also disclosed. The pluggable mechanism has a simple structure, high reliability, good operability, no occupation of vertical space, and small motion resistance, and is suitable for board plugging requiring great force for inserting and removing.

21 Claims, 6 Drawing Sheets

PLUGGABLE MECHANISM, PRODUCTION BOARD AND SUBRACK HAVING THE PLUGGABLE MECHANISM

CROSS-REFERENCE TO RELATED APPLICATIONS

This application is a continuation of International Application No. PCT/CN2011/073627, filed on May 4, 2011, which claims priority to Chinese Patent Application No. 201010213955.7, filed on Jun. 28, 2010, both of which are hereby incorporated by reference in their entireties.

FIELD OF THE INVENTION

The present invention relates to a motion mechanism, and in particular, to a pluggable mechanism, and a production board and subrack having the pluggable mechanism.

BACKGROUND OF THE INVENTION

In a conventional device, a backplane is horizontally disposed at the bottom of a subrack, and a PCB board is vertically inserted from the front of the subrack into the subrack and then moved downward to fit into the backplane. In this way, the resistance and restraint from the backplane on the back side of the subrack can be eliminated, a direct front-to-back air duct is formed in the subrack, and heat dissipation is implemented through the front-to-back air duct, thereby improving the heat dissipation capability. Usually, a pluggable mechanism is used to drive the PCB board to implement the two-dimensional operation of inserting the PCB board into the subrack horizontally, then inserting the PCB board into or removing the PCB board from the backplane vertically. The conventional pluggable mechanism has at least the following disadvantages:

1. Complex structure, multi-step drive, and insufficient operation reliability.
2. Occupation of vertical space.
3. Great motion resistance, laborious operation, and poor operability, especially unsuitable for the PCB board plugging requiring great force for inserting or removing.

SUMMARY OF THE INVENTION

Embodiments of the present invention provide a pluggable mechanism, and a production board and subrack having the pluggable mechanism. The pluggable mechanism has a simple structure, high reliability, good operability, no occupation of vertical space, and small motion resistance, and is suitable for board plugging requiring great force for inserting and removing.

An embodiment of the present invention provides a pluggable mechanism, which is disposed between a bearing board and a to-be-inserted board. The pluggable mechanism includes: a gear wrench hinged on the bearing board, where the gear wrench has a handle and a drive tooth part; and a swing gear, hinged on the bearing board and connected to the to-be-inserted board, where the swing gear has a gearing tooth part meshing with the drive tooth part, and the to-be-inserted board moves with the move of the swing gear.

An embodiment of the present invention also provides a production board including the pluggable mechanism, a bearing board, and a to-be-inserted board, where the pluggable mechanism is disposed between the bearing board and the to-be-inserted board.

An embodiment of the present invention also provides a subrack including the production board and a housing, where the production board is inserted into the housing by sliding.

The pluggable mechanism according to the above solutions has an obvious effect as compared with the conventional structure: With the pluggable mechanism, production board, and subrack provided by embodiments of the present invention, the pluggable mechanism has a simple structure and high operation reliability; the pluggable mechanism is disposed between the bearing board and a to-be-inserted board and does not occupy vertical space; the torque applied on the handle of the gear wrench directly drives the swing gear to swing upward and downward on the back swing plane; the pluggable mechanism has small motion resistance and good operability, and is suitable for board plugging requiring many connectors and great force for inserting and removing.

DETAILED DESCRIPTION OF THE EMBODIMENTS

Embodiment 1

Figure 1:
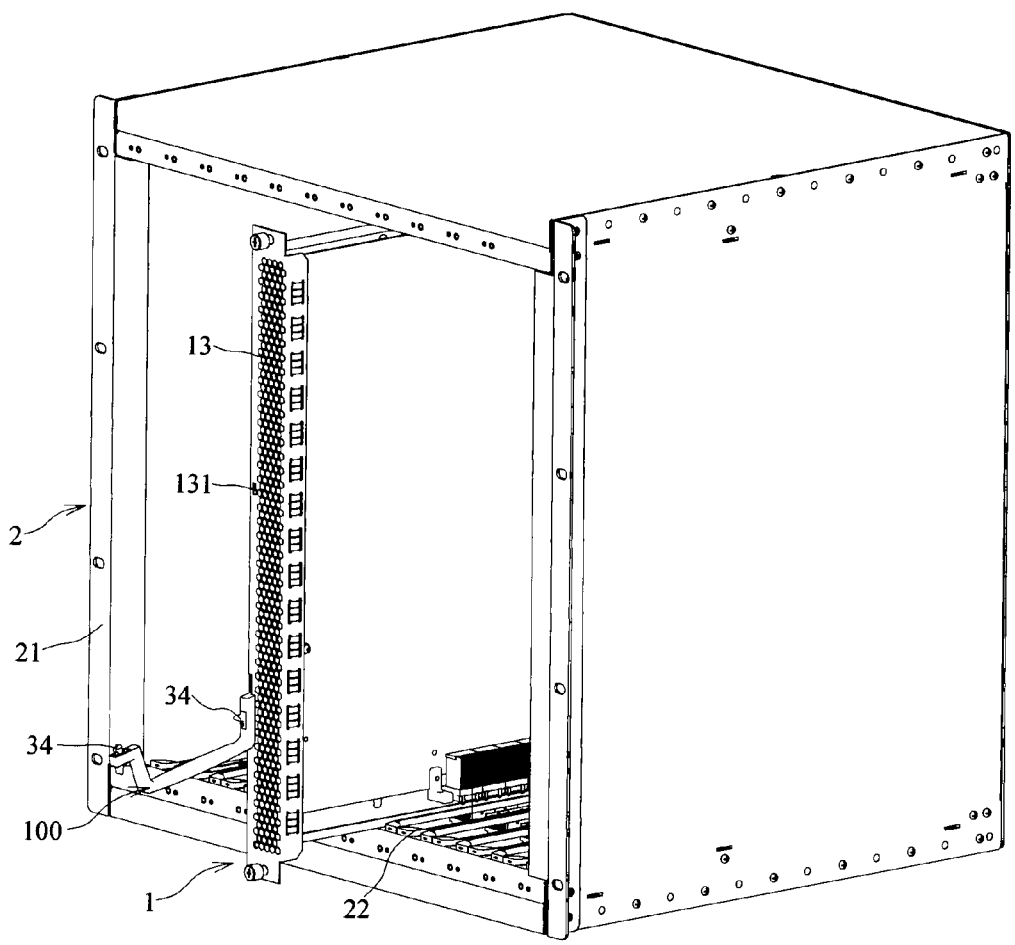
FIG. 1 is a schematic diagram of a subrack according to a first embodiment of the present invention.

As shown in FIG. 1, the embodiment of the present invention provides a pluggable mechanism 100, and a production board 1 having the pluggable mechanism 100 and a subrack 2 having the pluggable mechanism 100.

The subrack 2 includes a housing 21 and the production board 1 that is inserted into the housing 21 by sliding. If a backplane is disposed at the bottom of the housing 21, the subrack 2 can form a direct front-to-back air duct, so as to achieve good heat dissipation effect. In this state, the production board 1 needs to be in a vertical position to plug in the backplane. A guide rail 22 is disposed at the bottom of the housing 21, and the bottom of the production board 1 is inserted into the guide rail 22 by sliding, while the backplane is disposed below the guide rail 22.

Figure 2:
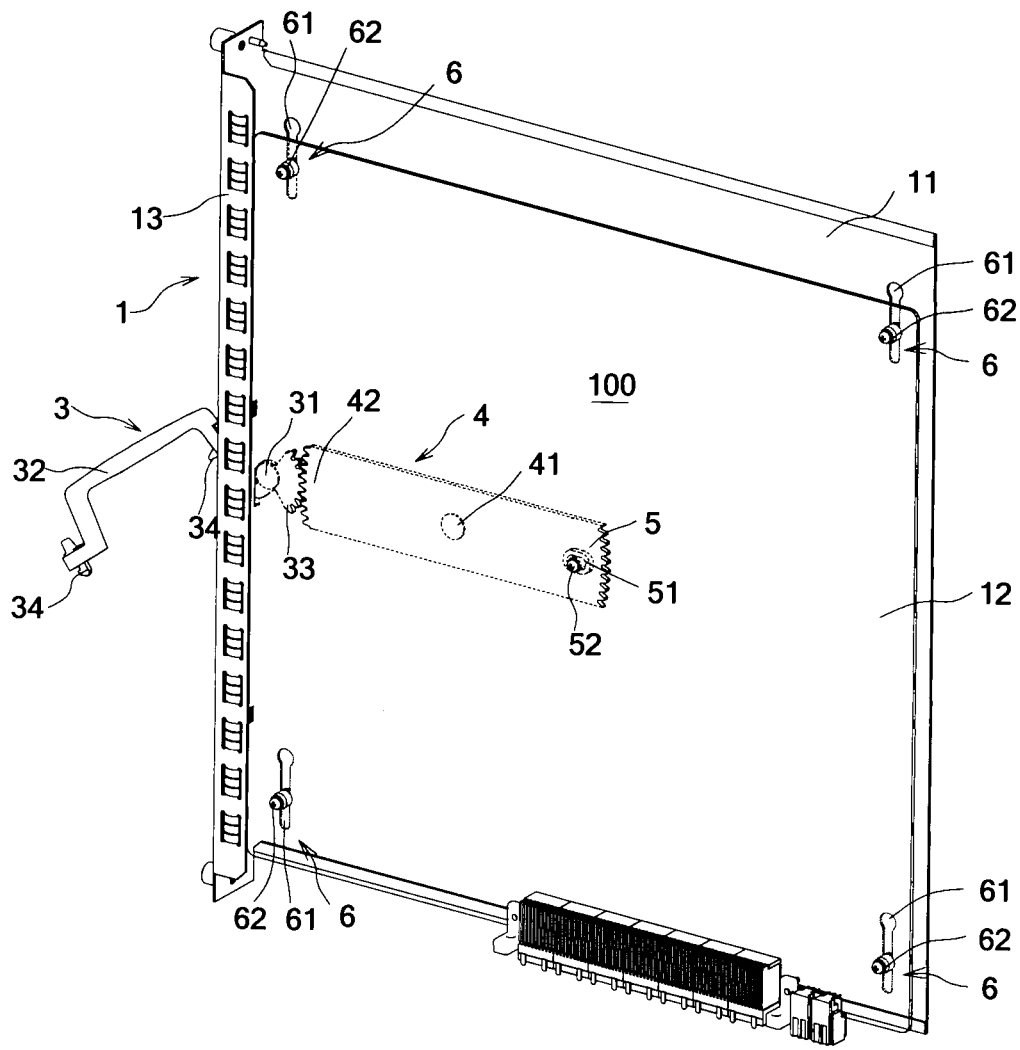
FIG. 2 is a schematic diagram of a production board according to the first embodiment of the present invention.
Figure 3:
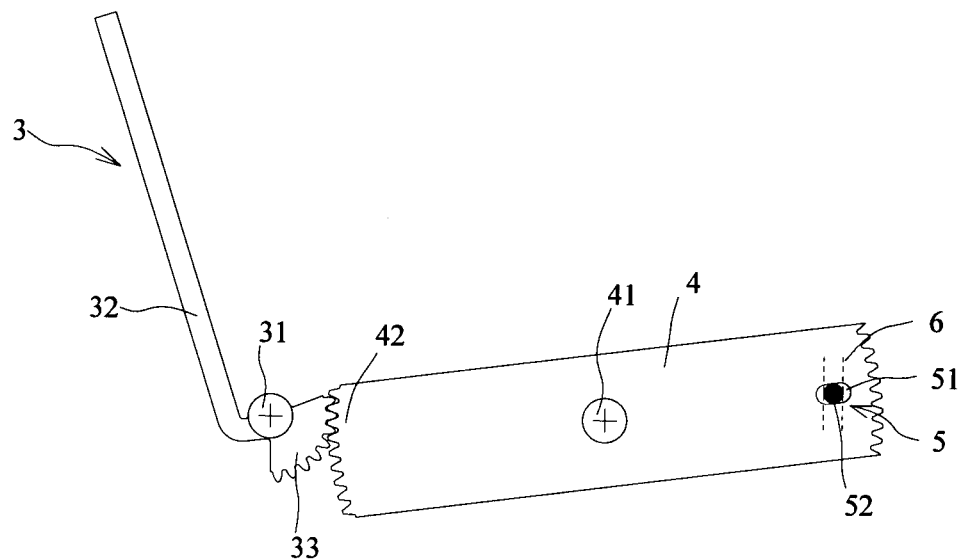
FIG. 3 is an amplified diagram of a pluggable mechanism according to the first embodiment of the present invention.

As shown in FIGS. 2 and 3, the production board 1 includes a bearing board 11, a to-be-inserted board 12 (for example PCB boards such as a PCI card), and a pluggable mechanism 100 located between the bearing board 11 and the to-be-inserted board 12. The production board 1 may further include a panel 13, and the panel 13 may be integrated, for example, on the bearing board 11.

The pluggable mechanism 100 in the embodiment of the present invention is disposed between the bearing board 11 and the to-be-inserted board 12 of the production board 1, and does not occupy the vertical space of the production board 1 and subrack 2. The pluggable mechanism 100 includes:

a gear wrench 3, hinged on the bearing board 11 through a pivot hinge 31, where the gear wrench 3 has a handle 32 and a drive tooth part 33 which are located on two sides of the hinging point of the pivot hinge 31, respectively; and a swing gear 4, hinged on the bearing board 11 through a pivot hinge 41 and connected to the to-be-inserted board 12, where the swing gear 4 has a gearing tooth part 42 meshing with the drive tooth part 33.

After the production board 1 is inserted into the housing 21 along the guide rail 22 of the subrack 2 in position, the handle 32 of the gear wrench 3 is rotated to cause the drive tooth part 33 to rotate downward around the pivot hinge 31, to drive the gearing tooth part 42 of the swing gear 4 to swing upward around the pivot hinge 41, and the other end of the swing gear 4 may swing downward to drive the to-be-inserted board 12 that is connected to the other end of the swing gear 4 to move downward, so as to plug the to-be-inserted board 12 into the backplane; if the handle 32 is reversed, the to-be-inserted board 12 is removed from the backplane.

It is conceivable that in the embodiment of the present invention, the backplane may also be disposed on the top of the subrack 2, and in this case, the motion direction of the pluggable mechanism 100 is opposite to the motion direction of the pluggable mechanism 100 when the backplane is disposed at the bottom of the subrack 2, so that the to-be-inserted board 12 moves upward to fit into the backplane. The backplane may also be vertically installed on the side wall of the subrack 2, and in this case, after the production board 1 is horizontally inserted into the subrack 2, the pluggable mechanism 100 drives the to-be-inserted board 12 to move left and right horizontally to fit into the backplane, which is not limited.

The pluggable mechanism 100 in the embodiment of the present invention has a simple structure and high reliability. The torque applied on the handle 32 of the gear wrench 3 directly drives the swing gear 4 to swing upward and downward around the pivot hinge 41 at a small angle on the back swing plane, and the direction of the applied torque is consistent with the motion direction of the swing gear 4. Therefore, the force loss is small, and the pluggable mechanism 100 has small motion resistance and good operability, and is suitable for board plugging requiring many connectors and great force for inserting and removing.

In an exemplary embodiment of the present invention, the swing gear 4 may be connected through a linking structure 5 to the to-be-inserted board 12; the linking structure 5 is disposed on the swing gear 4 and on the other side of the hinging point of the pivot hinge 41 relative to the gearing tooth part 42, and is located in the center position of the to-be-inserted board 12, so that force can be steadily applied on the to-be-inserted board 12. The linking structure 5 includes a horizontal guide rail 51 and a linking pin 52 that is disposed in the horizontal guide rail 51 and can slide in the horizontal guide rail 51. In this embodiment, the horizontal guide rail 51 is disposed on the swing gear 4, and the linking pin 52 is disposed on the back of the to-be-inserted board 12.

The pluggable mechanism 100 may further include a guide structure 6; the guide structure 6 includes a guide trough 61 and a guide pin 62 that slides in the guide trough 61; the extension direction of the guide trough 61 is vertical to the extension direction of the horizontal guide trough 51. In the embodiment in which the production board 1 is vertically inserted into the subrack 2, the guide trough 61 is vertical; in the embodiment in which the production board 1 is horizontally inserted into the subrack 2, the guide trough 61 extends in a plane where the production board 1 is located, and is non-vertical but is perpendicular relative to the horizontal guide trough 51. The guide structure 6 includes more than two groups of a guide trough 61 and a guide pin 62, and each group of a guide trough 61 and a guide pin 62 is located at a different corner of the to-be-inserted board 12, where a guide trough 61 and a guide pin 62 is collaborated with each other. In the embodiment, four groups of a guide trough 61 and a guide pin 62 are included, and are distributed at four corners of the to-be-inserted board 12, so as to make the guide force more even and the guide more smooth. The guide troughs 61 may be disposed on the bearing board 11, and the guide pins 62 are disposed on the back of the to-be-inserted board 12. It is conceivable that according to a symmetry replacement principle, the guide troughs 61 may also be disposed on the to-be-inserted board 12, while the guide pins 62 are disposed on the bearing board 11, which can also have the guide effect.

When the handle 32 of the gear wrench 3 is rotated, the drive tooth part 33 drives the swing gear 4 meshing with the drive tooth part 33 to swing, so that the horizontal guide rail 51 of the linking structure 5 moves upward and downward in an arc. When swinging upward and downward, the horizontal guide rail 51 drives the linking pin 52 to drive the to-be-inserted board 12 to move upward and downward; at the same time, because the guide pin 62 on the to-be-inserted board 12 is confined by the guide trough 61, the linking pin 52 moves upward and downward vertically when being confined jointly by the horizontal guide rail 51 and guide trough 61, and drives the to-be-inserted board 12 to move upward and downward vertically.

Figure 4:
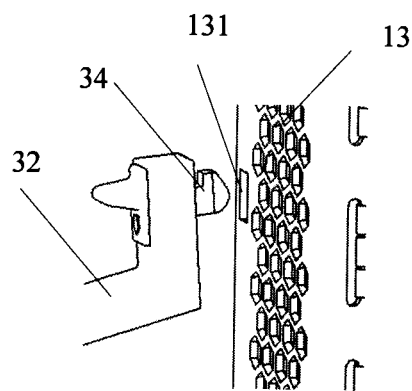
FIG. 4 is an amplified diagram of a locking apparatus that is in an unlocked state and is of a pluggable mechanism according to the first embodiment of the present invention.
Figure 5:
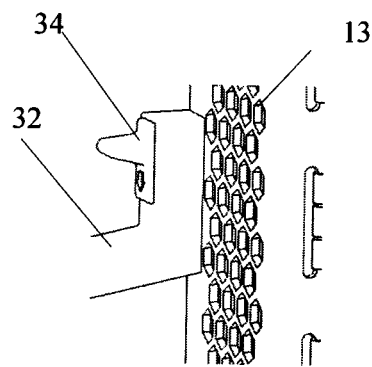
FIG. 5 is an amplified diagram of a locking apparatus that is in a locked state and is of the pluggable mechanism according to the first embodiment of the present invention.

In the embodiment of the present invention, a locking apparatus 34 is disposed at a near end of the handle 32 close to the hinging point of the pivot hinge 31 of the gear wrench 3, and a locking apparatus 34 is disposed at a free end of the handle 32 close to the hinging point of the pivot hinge 31 of the gear wrench 3. For example, the locking apparatus 34 is an elastic latch hook, and two locking holes 131 are opened on the panel 13, where the two locking holes 131 correspond to the two locking apparatus 34, as shown in FIGS. 4 and 5, so that locking is performed at the two limiting angle positions where the drive tooth part 33 meshes with the gearing tooth part 42. In the process of inserting and removing the production board 1 along the guide rail 22 of the subrack 2, the to-be-inserted board 12 needs to be in the upper position in the vertical direction, which is the upper limiting position. At this position, the locking apparatus 34 can keep the to-be-inserted board 12 at the upper part, to prevent the connector of the to-be-inserted board from colliding with the connector of the backplane. When the to-be-inserted board 12 is inserted into the backplane in position, the position is the lower limiting position. The locking apparatus 34 locks the pluggable mechanism 100 in the position, which can prevent the to-be-inserted board 12 from falling out of the backplane due to maloperation.

Embodiment 2

Figure 6:
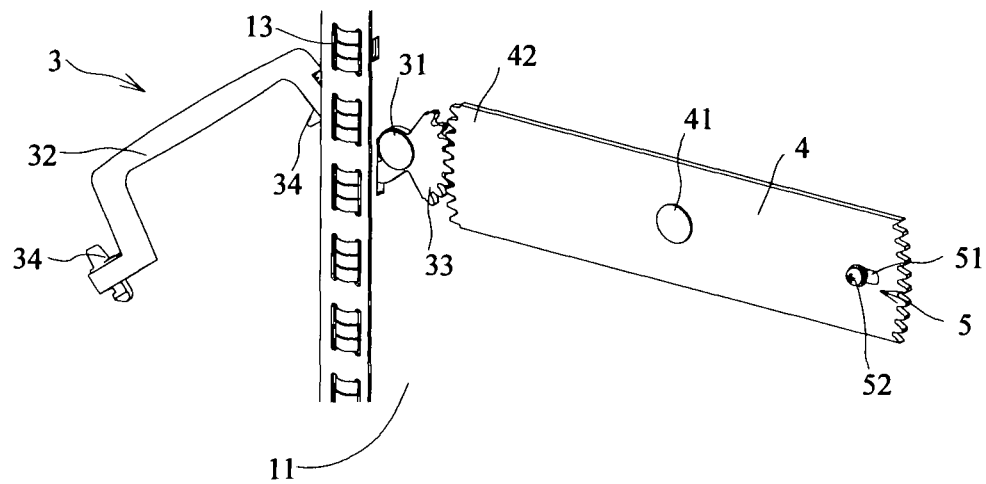
FIG. 6 is a schematic diagram of a subrack, a production board, and a pluggable mechanism according to a second embodiment of the present invention.

As shown in FIG. 6, the embodiment of the present invention provides a pluggable mechanism 100, and a production board 1 and subrack 2 having the pluggable mechanism 100. Main structures, principles, and effects are the same as those of the first embodiment and are not described herein. For clarity and brevity, FIG. 6 does not illustrate the complete production board 1 and subrack 2, and only shows the difference, where the to-be-inserted board 12 in the production board 1 is already removed to make the pluggable mechanism 100 visible. The difference between this embodiment and the first embodiment is that the horizontal guide rail 51 of the linking structure 5 is disposed on the to-be-inserted board 12, while the linking pin 52 is disposed on the swing gear 4.

Embodiment 3

Figure 7:
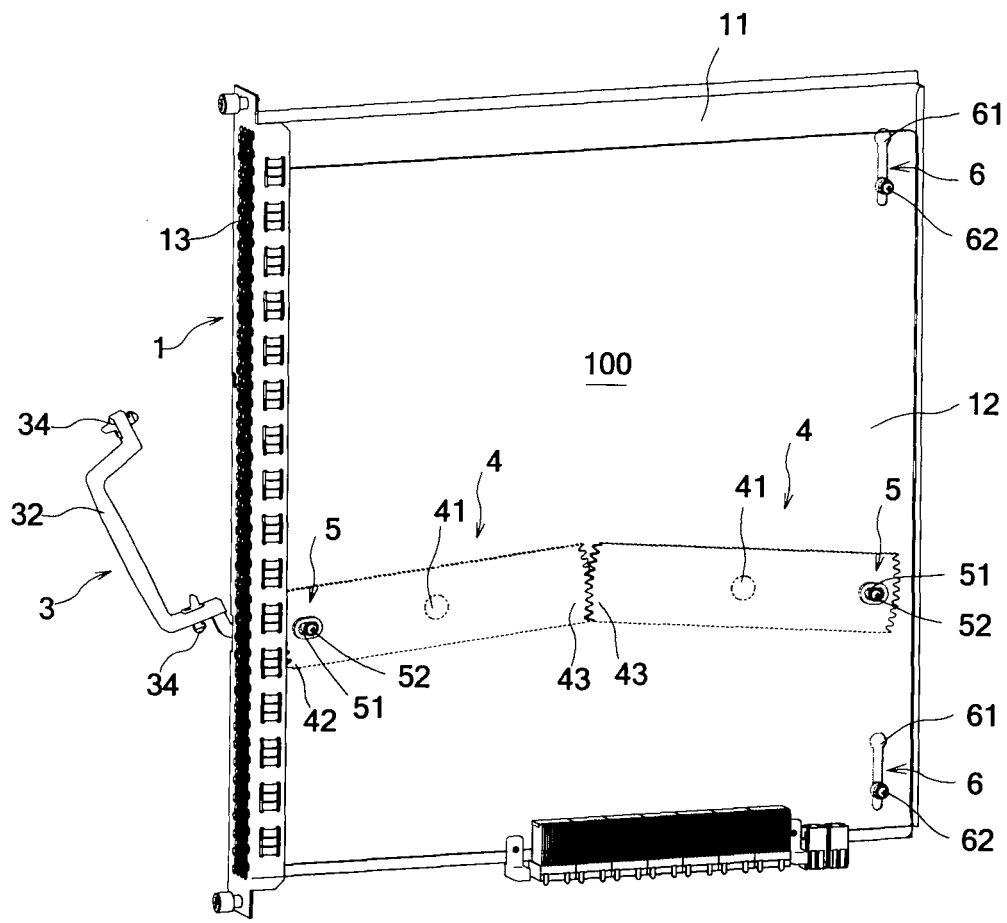
FIG. 7 is a schematic diagram of a subrack, a production board, and a pluggable mechanism according to a third embodiment of the present invention.

As shown in FIG. 7, the embodiment of the present invention provides a pluggable mechanism 100, and a production board 1 and subrack 2 having the pluggable mechanism 100. Main structures, principles, and effects are the same as those of the first embodiment and are not described herein. For clarity and brevity, FIG. 7 only illustrates the production board 1 and does not illustrate the subrack 2. The linking structure in this embodiment is the same as that in the first embodiment. The horizontal guide rail 51 is disposed on the swing gear 4, and the linking pin 52 is disposed on the back of the to-be-inserted board 12. The difference is as follows:

The pluggable mechanism 100 includes one gear wrench 3 and two swing gears 4; the gearing tooth part 42 of the swing gear 4 and the linking structure 5 are located on the same side of the hinging point of the pivot hinge 41 of the swing gear 4; a transitional tooth part 43 is disposed at the other end of the swing gear 4 where no gearing tooth part 42 is disposed; the two swing gears 4 mesh, along two transitional tooth parts 43, at the center position of the to-be-inserted board 12; the two gearing tooth parts 42 are disposed on two sides of the to-be-inserted board 12. In this embodiment, the pluggable mechanism 100 uses two swing gears 4 and two linking structures 5 to implement two-point driving of the to-be-inserted board 12 to move, and the two force points of the to-be-inserted board 12 are distributed at two sides. The force is more even, and the board plugging is smooth. Meanwhile, the horizontal component force generated due to the effect of the pressure angle of involute of the gears when the gear wrench 3 meshes with the gearing tooth part 42 of one swing gear 4 may completely offset the horizontal component force generated when the gear wrench 3 meshes with the transitional tooth part 43 of the two swing gears 4. The whole pluggable mechanism 100 has no component force and has good operability, and is especially suitable for board plugging requiring many connectors and great force for inserting and removing.

The guide structure 6 includes two groups of a guide trough 61 and a guide pin 62, which are distributed on two upper and lower corners of the to-be-inserted board 12, where the two upper and lower corners are on the right of the to-be-inserted board 12 and far away from the panel 13, which may further simplify the mechanism.

Embodiment 4

Figure 8:
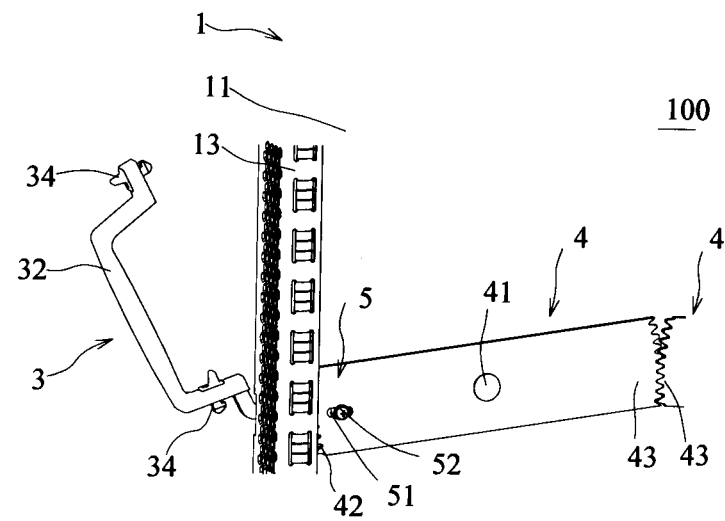
FIG. 8 is a schematic diagram of a subrack, a production board, and a pluggable mechanism according to a fourth embodiment of the present invention.

As shown in FIG. 8, the embodiment of the present invention provides a pluggable mechanism 100, and a production board 1 and subrack 2 having the pluggable mechanism 100. Main structures, principles, and effects are the same as those of the second embodiment and are not described herein. For clarity and brevity, FIG. 8 does not illustrate the complete production board 1 and subrack 2, where the to-be-inserted board 12 in the production board 1 is already removed to make the mainly described pluggable mechanism 100 visible. The difference between the second embodiment where two horizontal guide rails 51 of two linking structures 5 are disposed on two swing gears 4 and the linking pin 52 is disposed on the to-be-inserted board 12 and this embodiment lies in that two horizontal guide rails 51 of two linking structures 5 are both disposed on the to-be-inserted board 12 and two linking pins 52 are disposed on two swing gears 4.

Embodiment 5

Figure 9:
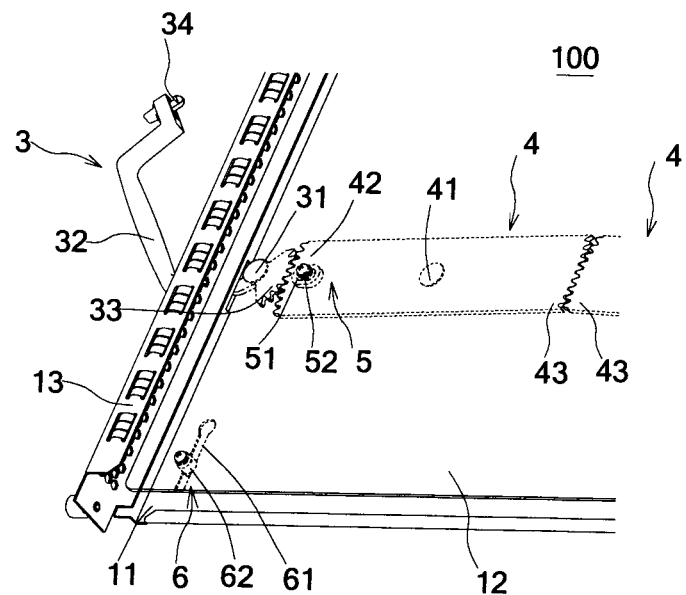
FIG. 9 is a schematic diagram of a subrack, a production board, and a pluggable mechanism according to a fifth embodiment of the present invention.

As shown in FIG. 9, the embodiment of the present invention provides a pluggable mechanism 100, and a production board 1 and subrack 2 having the pluggable mechanism 100. Main structures, principles, and effects are the same as those of the third and fourth embodiments and are not described herein. In the first embodiment to the fourth embodiment, the panel 13 is fixed on the bearing board 13, and thus has a movement relative to the to-be-inserted board 12. Therefore, when a connector of the board needs to be led out from the panel 13, a long opening needs to be cut at the corresponding position on the panel 13, and thus an EMC (electromagnetic compatibility) problem occurs. The particularity of this embodiment is: The panel 13 of the production board 1 and the bearing board 11 are separated as two independent parts, and the panel 13 is fixed on the to-be-inserted board 12. Therefore, the panel 13 moves with the to-be-inserted board 12, and can generate a movement relative to the bearing board 11, and the connector of the to-be-inserted board 12 can be led out from the panel 13 conveniently.

Embodiment 6

Figure 10:
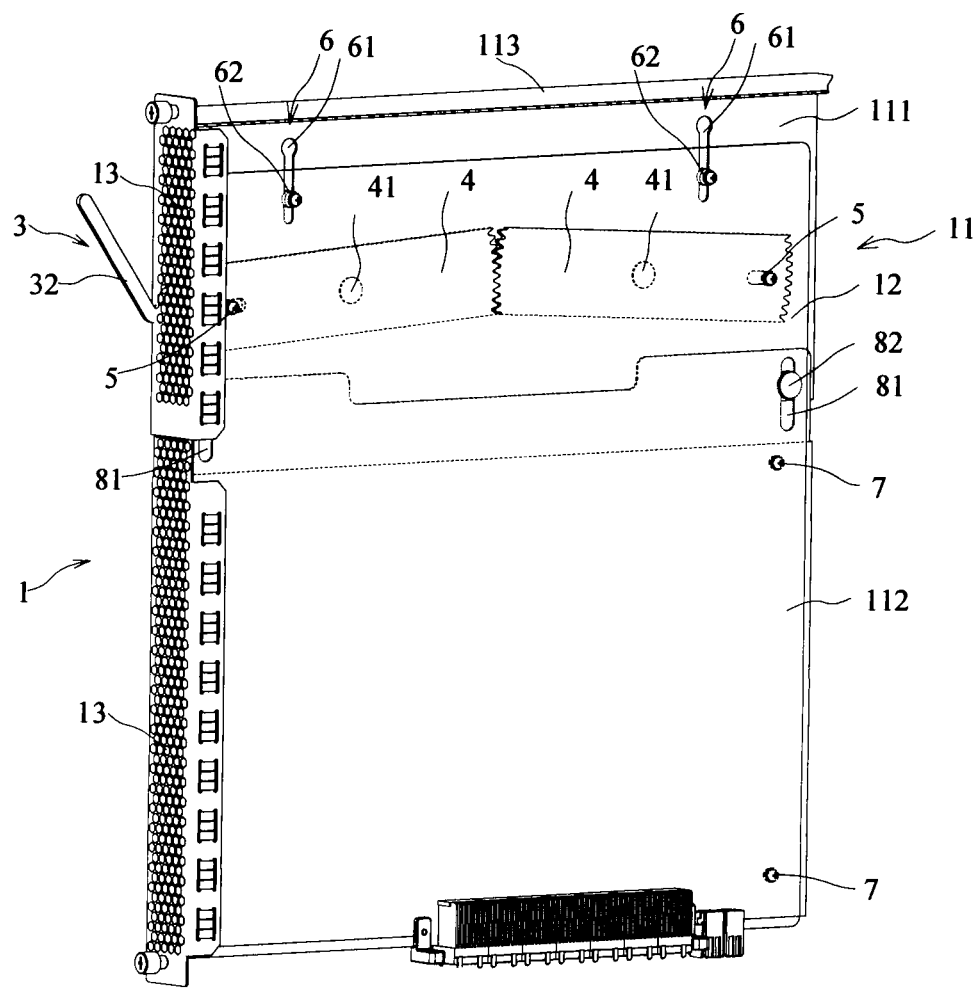
FIG. 10 is a schematic diagram of a subrack, a production board, and a pluggable mechanism according to a sixth embodiment of the present invention.

As shown in FIG. 10, the embodiment of the present invention provides a pluggable mechanism 100, and a production board 1 and subrack 2 having the pluggable mechanism 100. Main structures, principles, and effects are the same as those of the first to fifth embodiments and are not described herein. Different from the first embodiment to the fifth embodiment in which the production board 1 is inserted into the subrack 2 through the guide rail 22, this embodiment uses a T-shaped beam and T-shaped trough that are collaborated with each other and are disposed on the to-be-inserted board 12 to replace the guide rail 22.

The detailed structure is: The bearing board 11 of the production board 1 includes two parts: a fixing plate 111 and a movable plate 112; a panel 13 is fixed on each of the fixing plate 111 and movable plate 112. The pluggable mechanism 100 is disposed between the fixing plate 111 and the to-be-inserted board 12; the pluggable mechanism 100 is hinged and fixed on the fixing plate 111 through the pivot hinge 41; two groups of a guide trough 61 of the guide structure 6 are disposed on the fixing plate 111; and two guide pins 62 are disposed on the to-be-inserted board 12. The movable plate 112 is fixed, through a fixing pin 7, on the to-be-inserted board 12; other two groups of a guide trough 81 of the guide structure 6 are disposed on the movable plate 112; and a guide pin 82 is disposed on the fixing plate 111. A T-shaped bean 113 is disposed on the top of the fixing plate 111 and a T-shaped trough (not illustrated in FIG. 10) that is collaborated with the T-shaped bean 113 is disposed on the top of the subrack 2 to replace the guide rail 22 at the bottom of the subrack. When the pluggable mechanism 100 drives the to-be-inserted board 12 to move upward and downward, the movable plate 112 may move, with the to-be-inserted board 12, upward and downward relative to the fixing plate 111 along the guide pins 62 and 82, so that the panel 13 on the movable plate 112 has a movement relative to the fixing plate 111 of the bearing board 11, and thus the panel 13 may lead out an external interface, such as a connector, of the to-be-inserted board 12.

Detailed above are only about specific embodiments of the present invention, and the present invention is not limited thereto. All variations and modifications made based on the content of the present invention shall fall within the protection scope of the present invention.

What is claimed is:

1. A pluggable mechanism, wherein the pluggable mechanism is disposed between a bearing board and a to-be-inserted board, and the pluggable mechanism comprises:
   a gear wrench hinged on the bearing board, wherein the gear wrench comprises a handle and a drive tooth part;
   a swing gear, hinged on the bearing board and connected to the to-be-inserted board, wherein the swing gear comprises a gearing tooth part meshing with the drive tooth part, wherein the to-be-inserted board is movable with the swing gear; and
   at least one locking apparatus, wherein the at least one locking apparatus comprises a locking apparatus disposed at a near end of the handle close to a hinging point of the gear wrench, or a locking apparatus disposed at a free end of the handle, and wherein the at least one locking apparatus performs locking at least one limiting position where the drive tooth part meshes with the gearing tooth part.

2. The pluggable mechanism according to claim 1, wherein the swing gear is connected, through a linking structure, to the to-be-inserted board, wherein the linking structure comprises a horizontal guide rail and a linking pin that is slidable in the horizontal guide rail.

3. The pluggable mechanism according to claim 2, wherein the horizontal guide rail is disposed on the swing gear, and the linking pin is disposed on the to-be-inserted board; or
   the horizontal guide rail is disposed on the to-be-inserted board, and the linking pin is disposed on the swing gear.

4. The pluggable mechanism according to claim 2, further comprising a guide structure, wherein the guide structure comprises a guide trough and a guide pin that is slidable in the guide trough, and an extension direction of the guide trough is vertical to an extension direction of the horizontal guide rail.

5. The pluggable mechanism according to claim 4, wherein the guide trough is disposed on the bearing board, and the guide pin is disposed on the to-be-inserted board; or
   the guide trough is disposed on the to-be-inserted board, and the guide pin is disposed on the bearing board.

6. The pluggable mechanism according to claim 5, wherein the guide structure comprises more than two groups of a guide trough and a guide pin, and each of the more than two groups of a guide trough and a guide pin is located in a different corner of the to-be-inserted board, wherein a guide trough and a guide pin are collaborated with each other.

7. The pluggable mechanism according to claim 6, wherein the gearing tooth part and the linking structure are located on two sides of a hinging point of the swear gear, and the linking structure is located at a center position of the to-be-inserted board.

8. The pluggable mechanism according to claim 6, wherein: two swing gears are comprised in the pluggable mechanism; the gearing tooth part of each swing gear and linking structure are located on a same side of a hinging point of the swing gear; a transitional tooth part is disposed at an opposite end of the swing gear where no gearing tooth part is disposed; the two swing gears mesh, along two transitional tooth parts, at a center position of the to-be-inserted board, and two gearing tooth parts are disposed on two sides of the to-be-inserted board.

9. A production board, comprising a bearing board, a to-be-inserted board and a pluggable mechanism, wherein the pluggable mechanism is disposed between the bearing board and the to-be-inserted board, and the pluggable mechanism comprises:
   a gear wrench hinged on the bearing board, wherein the gear wrench comprises a handle and a drive tooth part;
   a swing gear, hinged on the bearing board and connected to the to-be-inserted board, wherein the swing gear comprises a gearing tooth part meshing with the drive tooth part, wherein the to-be-inserted board is movable with the swing gear; and
   at least one locking apparatus, wherein the at least one locking apparatus comprises a locking apparatus disposed at a near end of the handle close to a hinging point of the gear wrench, or a locking apparatus disposed at a free end of the handle, and wherein the at least one locking apparatus performs locking at at least one limiting position where the drive tooth part meshes with the gearing tooth part.

10. The production board according to claim 9, wherein the swing gear is connected, through a linking structure, to the to-be-inserted board, wherein the linking structure comprises a horizontal guide rail and a linking pin that is slidable in the horizontal guide rail.

11. The production board according to claim 10, wherein the horizontal guide rail is disposed on the swing gear, and the linking pin is disposed on the to-be-inserted board; or
   the horizontal guide rail is disposed on the to-be-inserted board, and the linking pin is disposed on the swing gear.

12. The production board according to claim 10, further comprising a guide structure, wherein the guide structure comprises a guide trough and a guide pin that is slidable in the guide trough, and an extension direction of the guide trough is vertical to an extension direction of the horizontal guide rail.

13. The production board according to claim 12, wherein the guide trough is disposed on the bearing board, and the guide pin is disposed on the to-be-inserted board; or
   the guide trough is disposed on the to-be-inserted board, and the guide pin is disposed on the bearing board.

14. The production board according to claim 13, wherein the guide structure comprises more than two groups of a guide trough and a guide pin, and each of the more than two groups of a guide trough and a guide pin is located in a different corner of the to-be-inserted board, wherein a guide trough and a guide pin are collaborated with each other.

15. The production board according to claim 14, wherein the gearing tooth part and the linking structure are located on two sides of a hinging point of the swear gear, and the linking structure is located at a center position of the to-be-inserted board.

16. The production board according to claim 14, wherein: two swing gears are comprised in the pluggable mechanism; the gearing tooth part of each swing gear and linking structure are located on a same side of a hinging point of the swing gear; a transitional tooth part is disposed at an opposite end of the swing gear where no gearing tooth part is disposed; the two swing gears mesh, along two transitional tooth parts, at a center position of the to-be-inserted board, and two gearing tooth parts are disposed on two sides of the to-be-inserted board.

17. The production board according to claim 9, further comprising a panel, wherein the panel is fixed on the to-be-inserted board, and is movable relatively to the bearing board.

18. A subrack, comprising a housing and a production board, wherein the production board is inserted into the housing by sliding, and the production board comprises a bearing board, a to-be-inserted board and a pluggable mechanism, wherein the pluggable mechanism is disposed between the bearing board and the to-be-inserted board, and the pluggable mechanism comprises:
- a gear wrench hinged on the bearing board, wherein the gear wrench comprises a handle and a drive tooth part;
- a swing gear, hinged on the bearing board and connected to the to-be-inserted board, wherein the swing gear comprises a gearing tooth part meshing with the drive tooth part, wherein the to-be-inserted board is movable with the swing gear; and
- at least one locking apparatus, wherein the at least one locking apparatus comprises a locking apparatus disposed at a near end of the handle close to a hinging point of the gear wrench, or a locking apparatus disposed at a free end of the handle, wherein the at least one locking apparatus performs locking at at least one limiting position where the drive tooth part meshes with the gearing tooth part.

19. The subrack according to claim 18, wherein the swing gear is connected, through a linking structure, to the to-be-inserted board, wherein the linking structure comprises a horizontal guide rail and a linking pin that is slidable in the horizontal guide rail.

20. The subrack according to claim 18, wherein the production board comprises a panel, wherein the panel is fixed on the to-be-inserted board, and is movable relatively to the bearing board.

21. The subrack according to claim 18, wherein the bearing board of the production board comprises a fixing plate and a movable plate, and the pluggable mechanism is disposed between the to-be-inserted board and the fixing plate, while the to-be-inserted board is fixed on the movable plate; a T-shaped bean is disposed on the top of the fixing plate, and a T-shaped trough is disposed on the top of the subrack; and a panel is fixed on the movable plate, wherein the T-shaped trough is collaborated with the T-shaped bean, and the panel is movable relatively to the fixing plate.

* * * * *